United States Patent
Lian et al.

(10) Patent No.: US 8,322,404 B2
(45) Date of Patent: Dec. 4, 2012

(54) HEAT DISSIPATION DEVICE FOR AT LEAST TWO ELECTRONIC DEVICES WITH TWO SETS OF FINS

(75) Inventors: Zhi-Sheng Lian, Shenzhen (CN);
Gen-Ping Deng, Shenzhen (CN);
Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 939 days.

(21) Appl. No.: 12/391,170

(22) Filed: Feb. 23, 2009

(65) Prior Publication Data
US 2010/0096107 A1   Apr. 22, 2010

(30) Foreign Application Priority Data
Oct. 20, 2008   (CN) .......................... 2008 1 0305011

(51) Int. Cl.
*F28F 7/00* (2006.01)
*F28D 15/00* (2006.01)
*H05K 7/20* (2006.01)
*H05K 7/00* (2006.01)
*H01L 23/34* (2006.01)

(52) U.S. Cl. ............. 165/80.3; 165/104.33; 361/679.48; 361/700; 257/715

(58) Field of Classification Search ............. 165/104.33, 165/80.3; 361/700, 704, 679.48; 257/715; 174/16.3
See application file for complete search history.

(56) References Cited

U.S. PATENT DOCUMENTS

| | | | | |
|---|---|---|---|---|
| 6,633,485 | B1 * | 10/2003 | Sigl et al. | 361/718 |
| 6,973,962 | B2 * | 12/2005 | Hwang et al. | 165/80.3 |
| 7,251,136 | B2 | 7/2007 | Yang et al. | |
| 7,451,806 | B2 * | 11/2008 | Zhou et al. | 165/104.33 |
| 7,537,046 | B2 * | 5/2009 | Zheng et al. | 165/80.3 |
| 7,760,501 | B2 * | 7/2010 | Zha et al. | 361/697 |
| 7,796,387 | B2 * | 9/2010 | Deng et al. | 361/697 |
| 7,870,890 | B2 * | 1/2011 | Liu | 165/104.33 |
| 8,002,019 | B2 * | 8/2011 | Min et al. | 165/80.3 |
| 2006/0289149 | A1 * | 12/2006 | He | 165/104.33 |
| 2007/0000646 | A1 * | 1/2007 | Chen et al. | 165/104.33 |
| 2007/0051501 | A1 * | 3/2007 | Wu et al. | 165/104.33 |
| 2008/0017351 | A1 * | 1/2008 | Zhou et al. | 165/80.3 |
| 2008/0128111 | A1 * | 6/2008 | Zhou et al. | 165/80.3 |
| 2008/0135215 | A1 * | 6/2008 | Wu | 165/104.33 |
| 2008/0236798 | A1 * | 10/2008 | Zheng et al. | 165/104.33 |
| 2008/0316707 | A1 * | 12/2008 | Liu | 361/700 |
| 2009/0161315 | A1 * | 6/2009 | Guo et al. | 361/700 |
| 2009/0242176 | A1 * | 10/2009 | Liu et al. | 165/104.33 |

* cited by examiner

*Primary Examiner* — Brandon M Rosati
(74) *Attorney, Agent, or Firm* — Altis Law Group, Inc.

(57) ABSTRACT

A heat dissipation device for removing heat from an electronic device and electronic components, includes a base plate in contact with the electronic device, a first fin set and a second fin set mounted on the base plate. The first fin set includes a plurality of first fins perpendicularly arranged on the base plate. The second fin set includes a plurality of second fins attached to a lateral side of the first fin set and perpendicular to both the first fins and the base plate. A fan is mounted on tops of the first fin set and the second fin set to cover both of them. Air generated by the fan flows through the first and second fin sets to cool the electronic components mounted on orthogonally neighboring sides of the heat dissipation device.

15 Claims, 3 Drawing Sheets

HEAT DISSIPATION DEVICE FOR AT LEAST TWO ELECTRONIC DEVICES WITH TWO SETS OF FINS

BACKGROUND OF THE INVENTION

1. Field of the Invention

The disclosure relates generally to heat dissipation devices and, more particularly, to a heat dissipation device incorporating a fan and heat pipes for removing heat from an electronic device and other electronic components mounted around the electronic device simultaneously.

2. Description of Related Art

It is well known that during operation computer electronic devices such as central processing units (CPU) generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan and heat pipes are incorporated into the heat sink. Usually, the fan is mounted to a top of the heat dissipation device. Conventionally, the heat sink mainly comprises a heat-conducting base for contacting the heat generating electronic device and a plurality of fins arranged on the base, wherein each heat pipe has an evaporating portion embedded in a top face or bottom face of the base and a condensing portion extending through the fins. Typically, the fins are parallel to each other and define a plurality of air passages therebetween. Airflow generated by the fan is blown downwardly into the passages between the fins, and then flows away from the fins via opposite openings of the air passages into two opposite sides of the heat sink, whereby the electronic components located at the two sides of the heat sink are cooled simultaneously by the airflow. Meanwhile, the heat generating electronic device is also cooled. However, the airflow generated by the fan can not reach another two opposite sides of the heat sink, thus other electronic components located at the another two opposite sides of the heat sink can not be cooled properly.

What is needed, therefore, is a heat dissipation device which can cool a main electronic component located under the heat dissipation device and can provide an airflow able to cool electronic components located near neighboring sides of the heat dissipation device simultaneously.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
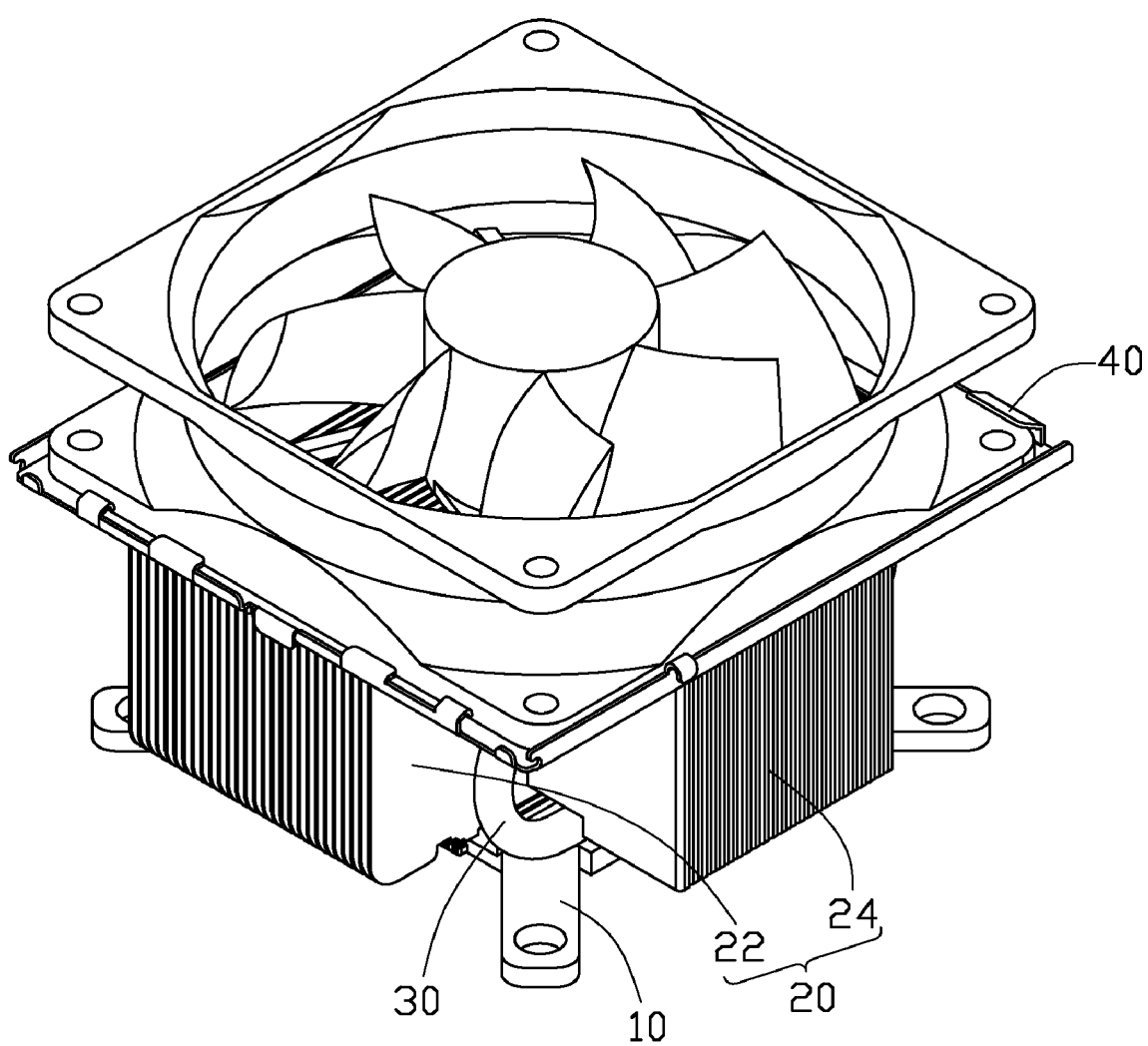
FIG. 1 is an assembled view of a heat dissipation device in accordance with an exemplary embodiment of the present disclosure.
Figure 2:
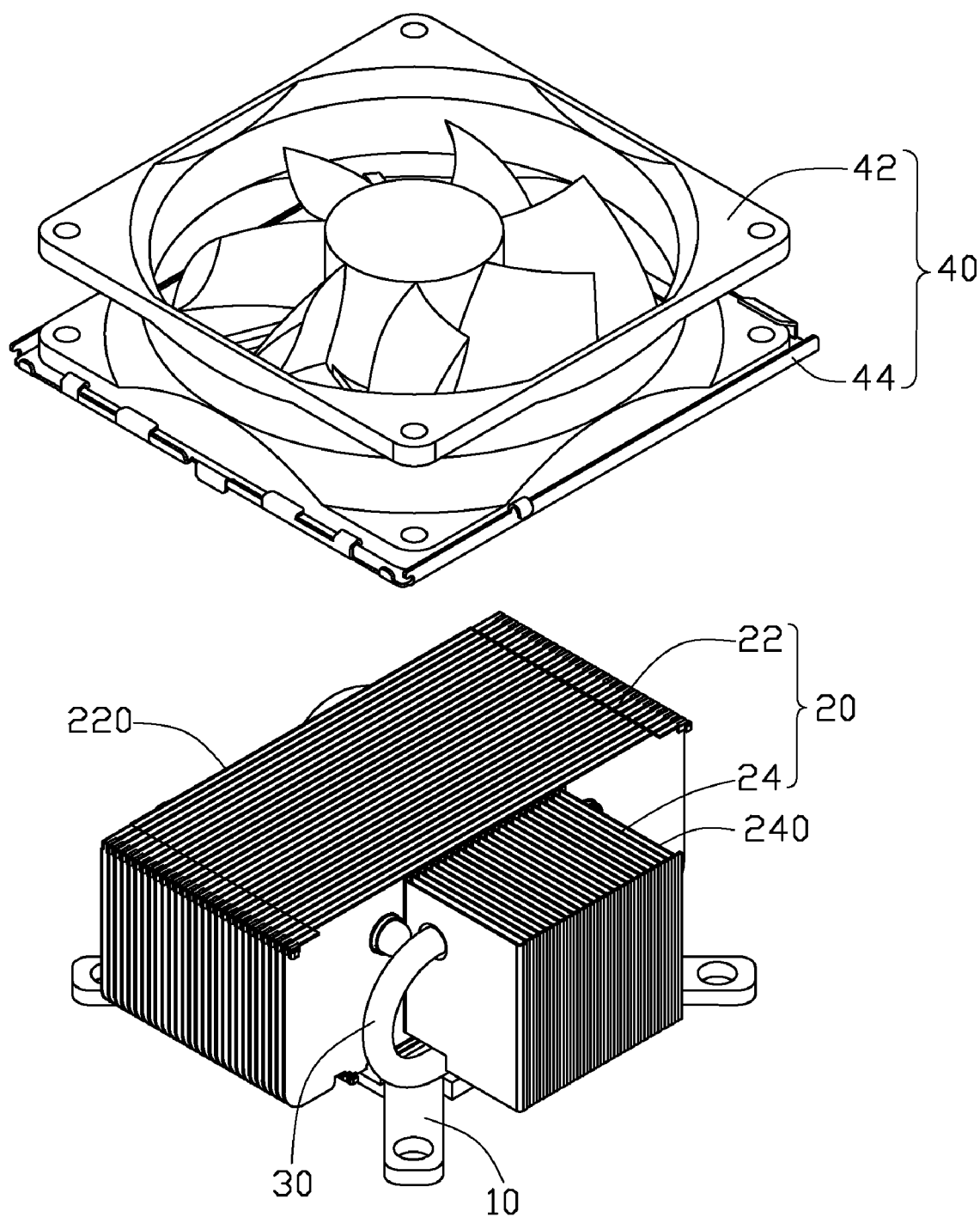
FIG. 2 is a partially exploded view of FIG. 1.
Figure 3:
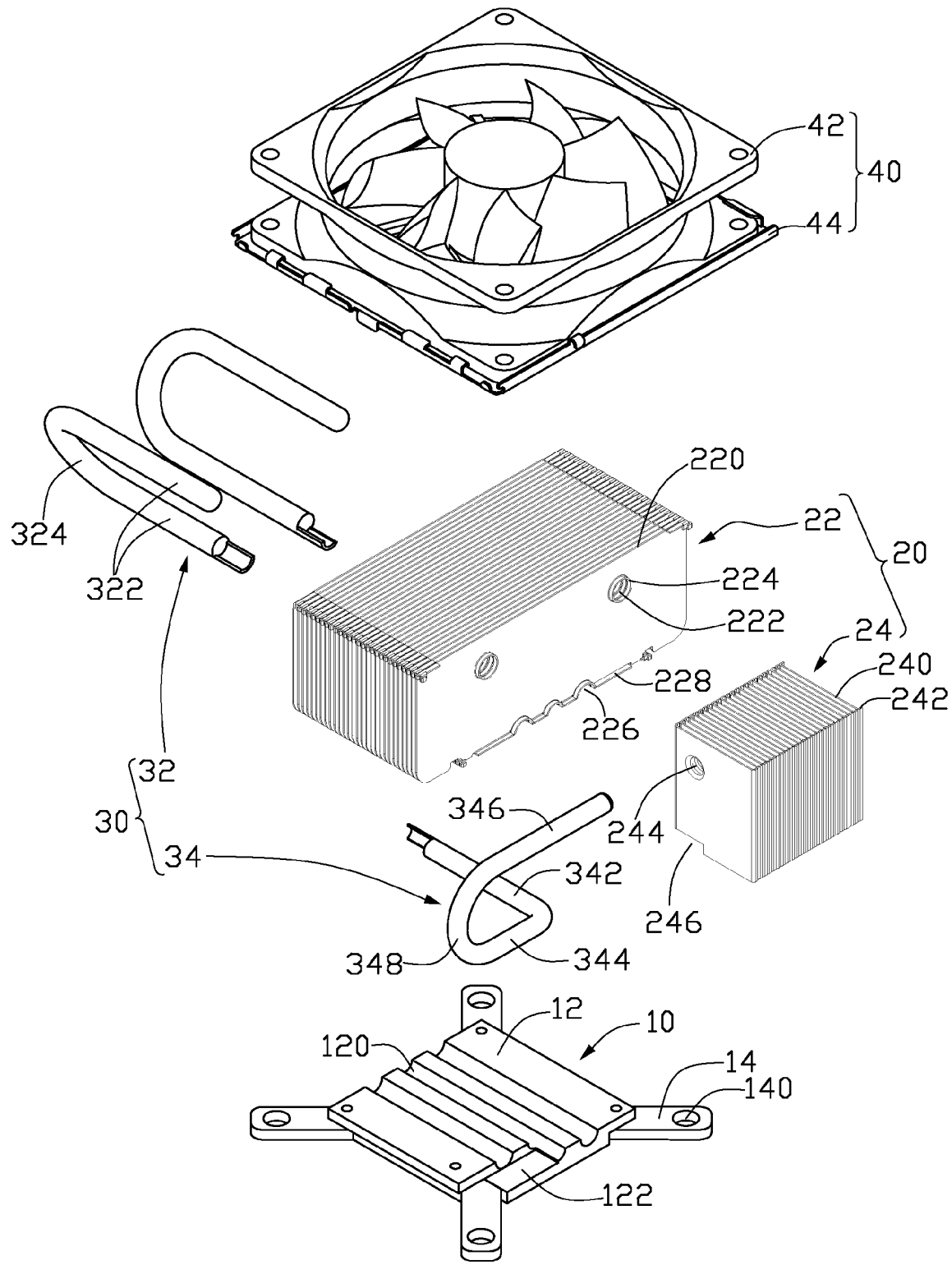
FIG. 3 is a further exploded view of the heat dissipation device in FIG. 2.

FIGS. 1 to 3 illustrate a heat dissipation device in accordance with an exemplary embodiment of the present disclosure. The heat dissipation device is provided for removing heat from an electronic device (not shown) and other electronic components (not shown) mounted around the electronic device simultaneously. Particularly, the electronic components are mounted near orthogonally neighboring sides of the heat dissipation device and the electronic device is mounted under the heat dissipation device. The electric device is a central processing unit (CPU), while the electronic components are north bridge chipset and MOSFET. The heat dissipation device comprises a base 10, a fin assembly 20 arranged on the base 10, a heat pipe assembly 30 thermally connecting the base 10 and the fin assembly 20 together and a fan assembly 40 mounted on a top of the fin assembly 20.

The base 10 is made of metallic material with high heat conductivity such as copper or aluminum, and comprises a rectangular base plate 12 and four fixing legs 14 extending outwardly from four corners of the base plate 12. The base plate 12 has a bottom surface for contacting the electronic device and a top surface on which the fin assembly 20 is disposed. A plurality of receiving grooves 120 are defined in a middle portion of the top surface of the base plate 12. The receiving grooves 120 are spaced from each other and parallel to two opposite lateral sides (i.e., a left and right sides) of the base plate 12. A total quantity of the receiving grooves 120 is consistent with that of heat pipes 32, 34 included in the heat pipe assembly 30, and is three in this embodiment. A rectangular recession 122 is defined in the top surface of the base plate 12 and extends at a front, left corner of the base plate 12. The recession 122 extends transversely through a front end of a left receiving groove 120 to a middle of a front end of a middle receiving groove 120. Each fixing leg 14 extends outwards from the corner of the base plate 12 along a corresponding diagonal direction of the base plate 12 and defines a mounting hole 140 therein adjacent to a distal end thereof, for receiving a fixture (not shown) to mount the heat dissipation device onto a printed circuit board on which the electronic device and the electronic components are mounted.

The fin assembly 20 comprises a first fin set 22 placed on the top surface of the base plate 12 and a second fin set 24 horizontally coupled to a front side of the first fin set 22 by soldering and located over a front side of the top surface of the base plate 12. The second fin set 24 has a front portion (not labeled) extending forwardly beyond the front side of the top surface of the base plate 12. The first fin set 22 comprises a plurality of first fins 220 buckling together. The first fins 220 are spaced from each other with a constant distance, and are perpendicular to both the top surface of the base plate 12 and the receiving grooves 120 of the base plate 12. The first fins 220 define a plurality of first air passages therebetween. Each first air passage has two opposite first ends in communication with ambient air at the left and right sides of the first fin set 22 and a second end at a bottom of the first fin set 22. Each first fin 220 is substantially rectangular and has two opposite end portions extending outwards beyond the base plate 12. Each first fin 220 defines two spaced through holes 222 therein adjacent to an upper edge thereof and an annular flange 224 extending perpendicularly from an edge of the through hole 222. All of the through holes 222 and corresponding annular flanges 224 cooperate with each other to define two parallel first receiving channels (not labeled) which are perpendicular to the first fins 220 and parallel to the receiving grooves 120 of the base plate 12. Each first fin 220 has a flange 228 extending perpendicularly from a middle portion of a lower edge thereof. All of the flanges 228 cooperate with each other to define a flat contacting surface in contact with the top surface of the base plate 12. Three receiving grooves 226 corresponding to the three receiving grooves 120 of the base plate 12 are defined in the contacting surface and cooperate with the three receiving grooves of the base plate 12 respectively to define three second receiving channels (not labeled).

The second fin set 24 has a dimension smaller than that of the first fin set 22 and is coupled to a middle portion of the front lateral side of the first fin set 22 and located between the two first receiving channels of the first fin set 22. The second fin set 24 comprises a plurality of second fins 240 vertically arranged on a front portion of the base plate 12. The second fins 240 are perpendicular to the first fins 220 and have a height equal to that of the first fins 220, whereby the fin set assembly 20 has a flat top surface on which the fan assembly 40 is mounted. The second fins 240 define a plurality of second air passages therebeween. Each second fin 240 has two elongated flanges 242 extending perpendicular from two opposite sides (i.e., a front and rear sides) thereof. All of the elongated flanges 242 of the second fins 240 cooperate with each other to form an inner flat surface attached to the front side of the first fin set 22 by conventional means such as soldering or adhering, and an outer flat surface parallel to the inner surface. Each second air passage has two first ends sealed by the inner flat surface and the outer flat surface at the front and rear sides of the second fin set 24, and a second end at a bottom of the second fin set 24. A rectangular cutoff 246 corresponding to the rectangular recession 122 of the base plate 12 is defined in a corner of the bottom of the second fin set 24. The cutoff 246 cooperates with the rectangular recession 122 of the base plate 12 to define a receiving space (not labeled). An extending hole 244 is defined in the second fin set 24, perpendicular to the second fins 240 and located adjacent to a top of the second fin set 24 and above the rectangular cutoff 246.

The heat pipe assembly 30 comprises two first heat pipes 32 and a second heat pipe 34. Each first heat pipe 32 is U-shaped and has two parallel horizontal portions 322 and an arched connecting portion 324 interconnecting the two horizontal portions 322. A lower one of the two horizontal portions 322 functions as an evaporating portion, while an upper one functions as a condensing portion of the first heat pipe 32. In this embodiment, the two first heat pipes 32 are identical to each other. The second heat pipe 34 comprises an evaporating portion 342, a condensing portion 346 above and perpendicular to the evaporating portion 342 and a connecting portion (not labeled) interconnecting the evaporating portion 342 and the condensing portion 346. The connecting portion comprises a linear portion 344 extending perpendicularly from an end of the evaporating portion 342 and an arched portion 348 interconnecting the linear portion 344 and the condensing portion 346, wherein the condensing portion 346 and the connecting portion are coplanar with each other and located at a vertical plane to which the evaporating portion 342 is perpendicular.

The fan assembly 40 comprises a fan 42 and a fan holder 44 securing the fan 42 on the top of the fin assembly 20. The fan 42 wholly covers the top of the fin assembly 20 and has a rear portion extending rearwards beyond a rear side of the fin assembly 20 opposite to the second fin set 24, and two front corners over two spaces between the front side of the first fin set 22 and lateral sides of the second fin set 24.

In assembly of the heat dissipation device, the two lower horizontal portions 322 of the two first heat pipes 32 are received in the two lateral ones of the second receiving channels cooperatively formed by the two lateral ones of the receiving grooves 120 of the base plate 12 and two lateral ones of the receiving grooves 226 of the first fin set 22. Two upper horizontal portions 322 of the two first heat pipes 32 are received in the first receiving channels cooperatively formed by the through holes 222 and the annular flanges 224 of the first fins 220, while the two connecting portions 324 of the first heat pipes 32 are located at the rear side of the fin assembly 20 opposite to the second fin set 24 and covered by the rear portion of the fan 42. The evaporating portion 342 of the second heat pipe 34 is received in the middle one of the second receiving channels formed by the middle one of the receiving grooves 120 of the base plate 12 and a middle one of the receiving grooves 226 of the first fin set 22. The condensing portion 346 of the second heat pipe 34 is received in the extending hole 244 of the second fin set 24. The connecting portion of the second heat pipe 34 connects the evaporating portion 342 and the condensing portion 346 together, wherein the linear portion 344 of the connecting portion parallel to the evaporating portion 346 is accommodated in the receiving space cooperatively defined by the rectangular recession 122 of the base plate 12 and the cutoff 246 of the second fin set 24, while the arched portion 348 of the connecting portion is located at the front side of the first fin set 22 opposite to the connecting portions 324 of the first heat pipes 32.

In use of the heat dissipation device, heat generated by the electronic device is absorbed by the base plate 12, then transferred to the first fin set 22 directly or indirectly via the first heat pipes 32 and also transferred to the second fin set 24 via the second heat pipe 34. The heat distributed over the first and second fin sets 22, 24 is finally dissipated into ambient air by an airflow generated by the fan 42. One part of the airflow generated by the fan 42 passes through the first air passages of the first fin set 22 to reach the two opposite sides (the left and right sides) of the heat dissipation device via the two first ends of the first air passages, and cool one of the electronic components located near one of the left and right sides of the heat dissipation device, while other part of the airflow passes through the second air passages of the second fin set 24 via the second ends of the second air passages to reach the front side of the heat dissipation device and cool the other one of the electronic components located under the second ends of the second air passages of the second fin set and near the front side of the heat dissipation device. Thus, the electronic components located at orthogonally neighboring sides of the heat dissipation device can be simultaneously cooled by the airflow generated by the fan 42 of the fan assembly 40. In addition, the electronic device contacting a bottom of the base plate 12 is also cooled.

It is believed that the present embodiments and their advantages will be understood from the foregoing description, and it will be apparent that various changes may be made thereto without departing from the spirit and scope of the invention or sacrificing all of its material advantages, the examples hereinbefore described merely being exemplary or exemplary embodiments of the invention.

What is claimed is:

1. A heat dissipation device adapted for removing heat from an electronic device and at least two electronic components, comprising:
   a rectangular base plate having a bottom adapted for contacting with the electronic device;
   a first fin set comprising a plurality of first fins perpendicularly arranged on the base plate;
   a second fin set comprising a plurality of second fins attached to a lateral side of the first fin set and perpendicular to both the first fins and the base plate;
   a fan mounted on the first fin set and the second fin set, wherein the fan covers tops of the first fin set and the second fin set and an airflow generated by the fan flows to three lateral sides of the heat dissipation device through the first fin set and the second fin set, adapted to cool the at least two electronic components located near orthogonally neighboring sides of the base plate; and two first heat pipes thermally connecting the base plate and the first fin set and a second heat pipe thermally connecting the base plate and the second fin set;

wherein the second heat pipe comprises an evaporating portion sandwiched between a bottom of the first fin set and the base plate, a condensing portion extending through the second fin set and a connecting portion interconnecting the evaporating portion and the condensing portion of the second heat pipe;

wherein the connecting portion of the second heat pipe comprises a linear portion sandwiched between a bottom of the second fin set and the base and an arched portion located at the lateral side of the first fin set; and wherein the base plate defines a recession in a corner of the top surface thereof, the second fin set defines a cutoff in a corner of the bottom thereof, and the recession and the cutoff cooperatively define a receiving space accommodating the linear portion of the connecting portion of the second heat pipe.

2. The heat dissipation device of claim 1, wherein each of the first heat pipes comprises a lower horizontal portion, an upper horizontal portion and a connecting portion interconnecting the lower and upper horizontal portions, wherein the lower horizontal portions of the two first heat pipes are sandwiched between a bottom of the first fin set and the base plate, the upper horizontal portions of the two first heat pipes are extended through the first fin set.

3. The heat dissipation device of claim 2, wherein the upper and lower horizontal portions are perpendicular to the first fins, the two connecting portions are located at a side of the first fin set opposite to the second fin set.

4. The heat dissipation device of claim 2, wherein the second fin set is coupled to a middle part of the lateral side of the first fin set and located between the two upper horizontal portions of the first heat pipes.

5. The heat dissipation device of claim 3, wherein the fan is located over the two connecting portions of the first heat pipes.

6. The heat dissipation device of claim 1, wherein the evaporating portion of the second heat pipe is located between the lower horizontal portions of the first heat pipes and perpendicular to the first fins, the condensing portion thereof is perpendicular to both the evaporating portion thereof and the second fins and parallel to the first fins.

7. The heat dissipation device of claim 1, wherein the first fins have opposite end portions stretching outwards beyond two opposite ends of the base plate and flanges extending from middle portions of lower edges thereof, all of the flanges of the first fins cooperating with each other to define a flat surface in contact with a top surface of the base plate.

8. The heat dissipation device of claim 7, wherein a plurality of receiving grooves are correspondingly defined in the flat surface of the first fin set and the top surface of the base plate to cooperatively form receiving channels receiving the lower horizontal portions of the first heat pipes and the evaporating portion of the second heat pipe.

9. The heat dissipation device of claim 1, wherein four fixing legs extend outwards from four corners of the base plate along corresponding diagonal directions of the base plate and each define a mounting hole therein.

10. A heat dissipation device adapted for removing heat from an electronic device and at least two electronic components, comprising:

a rectangular base plate adapted for contacting with the electronic device;

a first fin set comprising a plurality of first fins perpendicularly arranged on the base plate;

a second fin set comprising a plurality of second fins extending outwards from a lateral side of the first fin set and perpendicular to both the first fins and the base plate;

a fan mounted on tops of the first fin set and the second fin set and covering the first and second fin sets, wherein an air flow generated by the fan flows through the first fin set to reach two opposite sides of the base plate and the second fin set to reach a third side of the base plate between the two opposite sides thereof, one of the at least two electronic components being adapted to be positioned near one of the two opposite sides of the base plate and another one of the at least two electronic components being adapted to be positioned near the third side of the base plate; and two first heat pipes thermally connecting the base plate and the first fin set and a second heat pipe thermally connecting the base plate and the second fin set;

wherein the second heat pipe comprises an evaporating portion sandwiched between a bottom of the first fin set and the base plate, a condensing portion extending through the second fin set and a connecting portion, comprising a linear portion sandwiched between a bottom of the second fin set and the base and an arched portion located at the lateral side of the first fin set, interconnecting the evaporating portion and the condensing portion; and wherein the base plate defines a recession in a corner of the top surface thereof, the second fin set defines a cutoff in a corner of the bottom thereof, and the recession and the cutoff cooperatively define a receiving space accommodating the linear portion of the connecting portion of the second heat pipe.

11. The heat dissipation device of claim 10, wherein the second fins have elongated flanges extending perpendicularly from two opposite sides thereof, all of the elongated flanges of the second fins cooperating with each other to form an inner flat surface attached to the lateral side of the first fin set and an outer flat surface parallel to the inner surface.

12. The heat dissipation device of claim 10, wherein each first heat pipe comprises two horizontal portions and a connecting portion interconnecting the two horizontal portions, wherein lower horizontal portions of the first heat pipes are sandwiched between a bottom of the first fin set and the base plate, upper horizontal portions thereof are extended through the first fin set.

13. The heat dissipation device of claim 12, wherein the evaporating portion is located between the first heat pipes and perpendicular to the first fins, the condensing portion is perpendicular to both the evaporating portion and the second fins and parallel to the first fins.

14. The heat dissipation device of claim 12, wherein the first fins have opposite end portions extending outwards beyond two opposite ends of the base plate and flanges extending from middle portions of lower edges thereof, all of the flanges of the first fins cooperating with each other to define a flat surface in contact with a top surface of the base plate.

15. The heat dissipation device of claim 14, wherein a plurality of receiving grooves are correspondingly defined in the flat surface of the first fin set and the top surface of the base plate to cooperatively form receiving channels receiving the lower horizontal portions of the first heat pipes and the evaporating portion of the second heat pipe.

* * * * *